United States Patent [19]
Dahlberg

[11] Patent Number: 4,748,483
[45] Date of Patent: May 31, 1988

[54] MECHANICAL PRESSURE SCHOTTKY CONTACT ARRAY

[75] Inventor: Reinhard Dahlberg, Flein, Fed. Rep. of Germany

[73] Assignee: Higratherm Electric GmbH, Heilbronn, Fed. Rep. of Germany

[21] Appl. No.: 157,806

[22] Filed: Jun. 9, 1980

[30] Foreign Application Priority Data

Jul. 3, 1979 [DE] Fed. Rep. of Germany ....... 2926756

[51] Int. Cl.⁴ .................... H01L 23/48; H01L 29/06; H01L 29/44; H01L 29/48
[52] U.S. Cl. ......................... 357/15; 357/55; 357/56; 357/79
[58] Field of Search ................. 357/9, 15, 81, 82, 55, 357/56, 79

[56] References Cited

U.S. PATENT DOCUMENTS

| | | | |
|---|---|---|---|
| 2,671,189 | 3/1954 | Gaudlitz | 357/79 |
| 2,841,508 | 7/1958 | Roup et al. | 357/15 |
| 3,153,581 | 10/1964 | Hitchins, IV | 357/68 |
| 3,231,795 | 1/1966 | Steinhelper | 357/79 |
| 3,450,958 | 6/1969 | Saxena | 357/15 |
| 3,458,778 | 7/1969 | Genzabella | 357/15 |
| 3,581,151 | 5/1971 | Boyle | 357/15 |
| 3,642,526 | 2/1972 | Itoh et al. | 357/15 |
| 3,689,993 | 9/1972 | Tolar | 357/15 |
| 3,740,617 | 6/1973 | Teramoto et al. | 357/81 |
| 3,755,752 | 8/1973 | Kim | 357/15 |
| 3,803,462 | 4/1974 | Fujta | 357/15 |
| 3,896,473 | 7/1975 | DiLorenzo et al. | 357/15 |
| 3,932,226 | 1/1976 | Klatskin et al. | 357/68 |
| 4,011,577 | 3/1977 | Tanimura et al. | 357/15 |
| 4,104,084 | 8/1978 | Evans | 357/15 |
| 4,127,830 | 11/1978 | Chalifour et al. | 357/68 |

FOREIGN PATENT DOCUMENTS

| | | |
|---|---|---|
| 1108813 | 6/1961 | Fed. Rep. of Germany . |
| 1208824 | 1/1966 | Fed. Rep. of Germany . |
| 1514748 | 8/1969 | Fed. Rep. of Germany . |
| 1149826 | 4/1970 | Fed. Rep. of Germany . |
| 2450172 | 4/1976 | Fed. Rep. of Germany ........ 357/82 |
| 2002810 | 2/1978 | Fed. Rep. of Germany . |
| 422165 | 4/1967 | Switzerland ......................... 357/81 |

OTHER PUBLICATIONS

IBM Technical Disclosure Bulletin, *SBD Defect Analysis Method* by Morrissey; vol. 21, No. 7, Dec. 1978, p. 2777.

Schäfer, *Herstellung Von p–n–Übergangen Durch Gemeinsame Plastische Verformung von p–Und n–Dotiertem Germanium*, Solid-State Electronics, vol. 11, (1968), pp. 675–681.

*Primary Examiner*—William D. Larkins
*Attorney, Agent, or Firm*—Spencer & Frank

[57] ABSTRACT

A Scottky diode arrangement comprises a metallically conducting plate and a semiconductive plate, one or both of which are provided with at least three raised portions which form electrically parallel Schottky contacts between the plates.

8 Claims, 3 Drawing Sheets

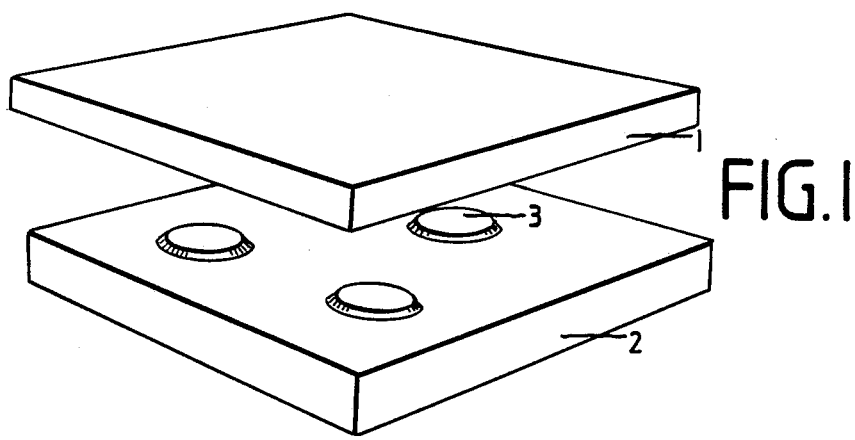
FIG.1
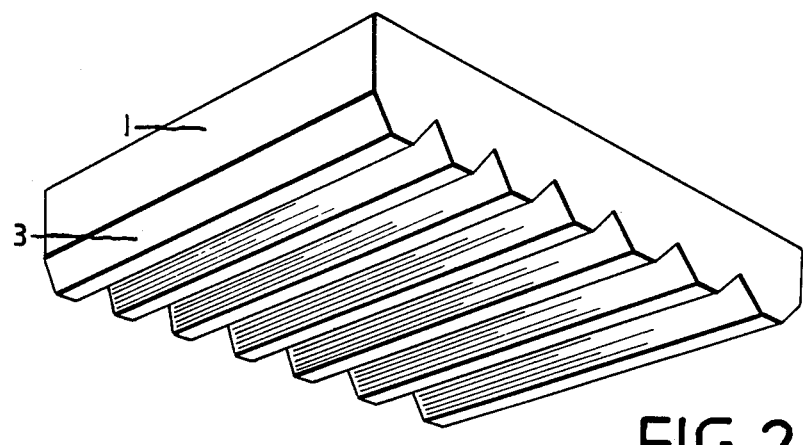
FIG.2
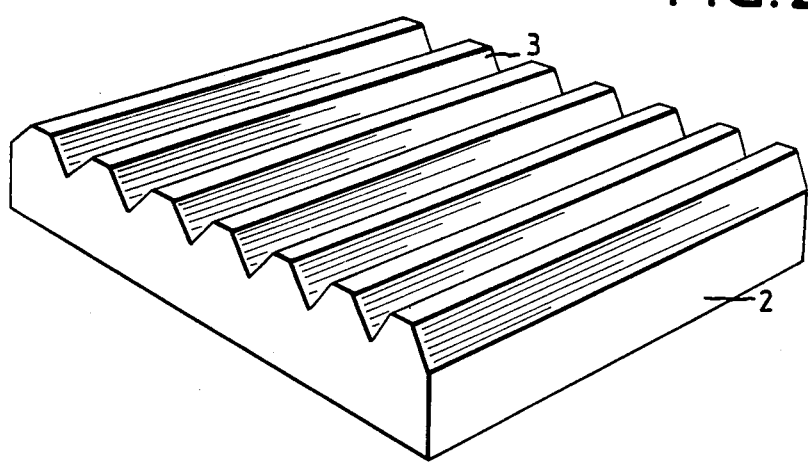

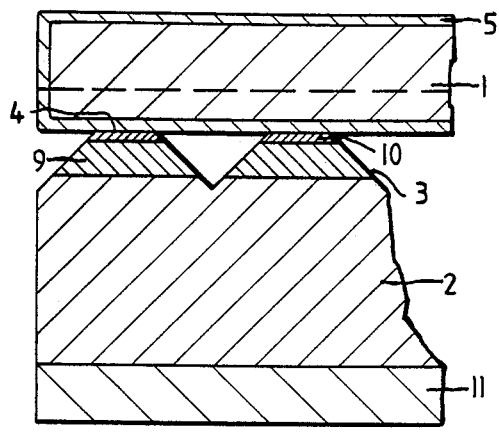
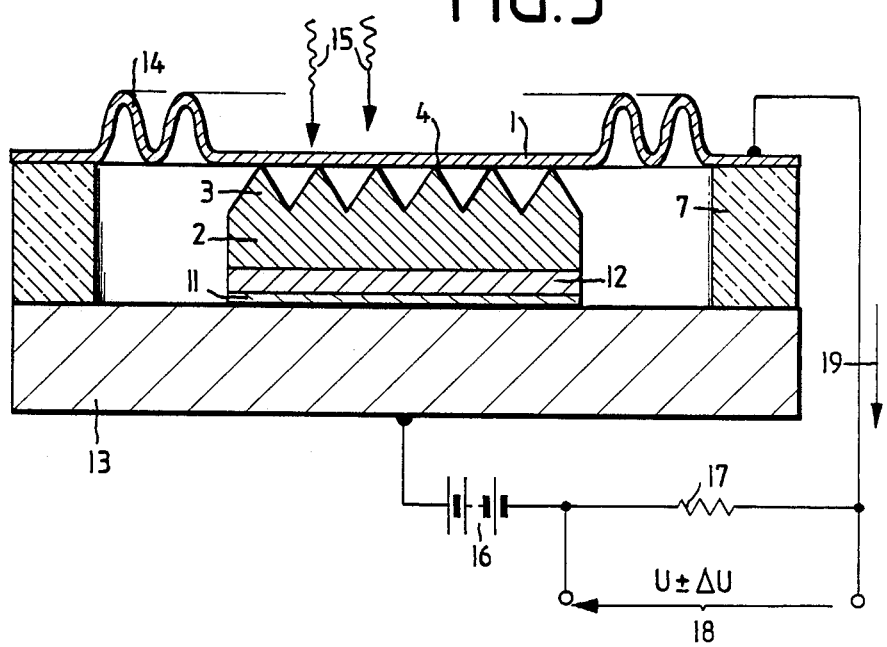

MECHANICAL PRESSURE SCHOTTKY CONTACT ARRAY

BACKGROUND OF THE INVENTION

The invention describes a Schottky diode arrangement in which a number of small-area metal semiconductor contacts are combined to form a mechanically stable component.

Besides some disadvantages, Schottky diodes, as is known, also have several advantages as compared to p/n diodes. They may be manufactured relatively easily, have small switching times and may be manufactured with relatively small gate voltages. In the last few years Schottky diodes have been manufactured as mixer diodes for higher and higher operating frequencies. With diode diameters of $5 \cdot 10^{-5}$ cm, frequencies of up to more than 4 THz have been achieved. D. T. Hodges and M. McColl, "Extension of the Schottky barrier detector 70 um (4.3 THz) using submicron-dimensional contacts", Appl. Phys. Letters., 30, 5–7 (1977). These Schottky diodes are seriously competing with metal oxide metal (MOM) point contact diodes because they are constructed by the planar technique and consequently have greater mechanical stability. Their manufacture is therefore more costly.

SUMMARY OF THE INVENTION

The object underlying the invention is to provide a Schottky diode arrangement which is mechanically stable and which may be constructed for operation up to extremely high frequencies and for high power. According to a first aspect of the invention there is provided a Schottky diode arrangement comprising a plate, disc or chip of metallically conducting material having two main surfaces and a plate, disc or chip of semiconductor material having two main surfaces, wherein at least one of said plates, discs or chips has on at least one of its said surfaces at least three raised portions, and said plates, discs or chips are located adjacent each other to form electrically parallel contacts therebetween by means of said raised portions. According to a second aspect of the invention there is provided a Schottky diode arrangement comprising a plate, disc or chip made from metallically conducting material and a plate, disc or chip made from semiconductor material, wherein at least one plate, disc or chip has on one of its two sides a structure with at least three raised portions, the plates, discs or chips being put together under pressure so that electrically parallel, pressure contacts are formed between them by the raised portions.

BRIEF DESCRIPTION OF THE DRAWING

FIG. 1 shows a general view of an embodiment of the present invention comprising a silicon chip.

FIG. 2 shows a n+-GaAs mixer diode arrangement for very high frequencies.

FIG. 4 shows a n-silicon Schottky diode with a small gate voltage.

FIG. 5 shows a Schottky diode arrangement used as a microphone.

DETAILED DESCRIPTION OF THE PREFERRED EMBODIMENTS

Figure 3A:
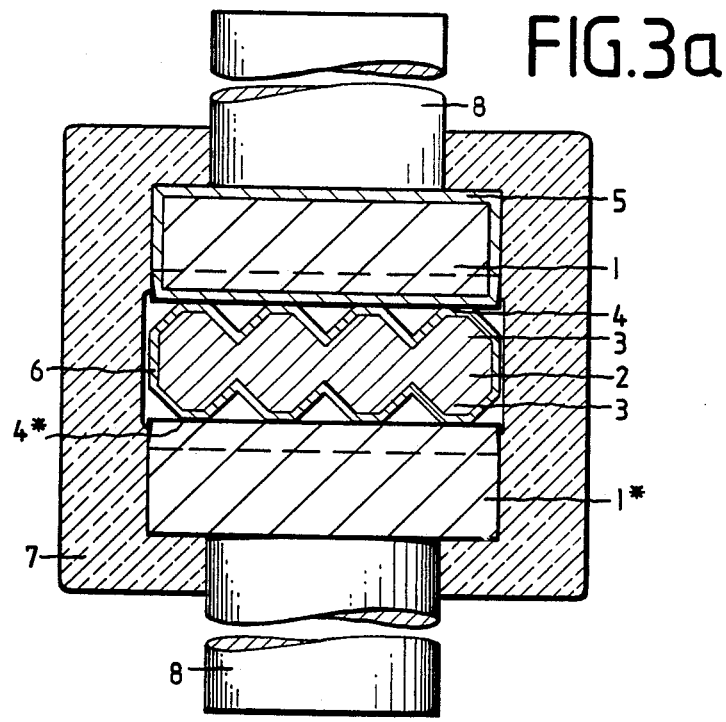
FIGS. 3a and 3b shows a n+-GaAs mixer diode with a thin layer of dioxide.

In accordance with the invention there is provided a plate, disc or chip made from metallically conductive material and a plate, disc or chip made from semiconductor material. The term 'plate' as used hereinafter is intended to include discs and chips. At least one plate has on one side of its two sides a structure with at least three raised portions; and the plates are put together under pressure so that pressure contacts connected electrically in parallel are formed between them by the raised portions. These electrically parallel, pressure contacts are preferably of equal area.

In a preferred embodiment of the invention the structure comprises parallel ridges. The two plates are put together under pressure applied between their structured surfaces so that the parallel rigdes in the structure of both plates intersect and form a regular distribution in terms of area of electrically parallel, pressure contacts. If N is the number of parallel rigdes in the structure of each plate, then $N^2$ pressure contacts are formed between the two plates. The principle of intersecting parallel ridges has already been described in German Offenlegungsschrift No. P 25 47 262. However, it is not disclosed in P 25 47 262 that Schottky diodes may be manufactured by this principle and a fortiori it is not disclosed how they may be so manufactured.

The plate comprising metallically conductive material may comprise a metal, an alloy, a metallically conductive compound, or a degenerated doped semiconductor.

The plate made from semiconductor material may comprise n- or p-conductive monocrystalline or polycrystalline elemental semiconductor or semiconductor compound.

The plate made from semiconductor material may be coated in accordance with a preferred feature of the present invention with an insulating layer, the thickness of which is smaller than $1 \cdot 10^{-6}$ cm. A chemical oxide, $SiO_2$, an anodic oxide, a thermal oxide, an electrolytic oxide, a pyrolytic oxide or nitride, among others, may be used as the insulator material.

The intermediate space between the elevations of the structure may be evacuated so that the two plates are pressed together by atmospheric pressure.

Several Schottky diode arrangements may be connected in series electrically.

Referring now to the drawing, five preferred embodiments of the present invention will be described.

Embodiment 1

In FIG. 1, 1 is a nickel chip and 2 is an n-silicon chip which has three conical raised portions 3, all of equal size, which are manufactured by means of an etching process. After putting together the two chips 1 and 2 the three raised portions 3 form Schottky contacts between the chips 1 and 2.

Embodiment 2

In FIG. 2, 1 is a tungsten plate on one side of which parallel ridges 3 are produced by means of an electrolytic etching process. The ridges 3 taper towards the upper surface and have a width there of $1 \cdot 10^{-5}$ cm. The ridges 3 are coated with a $5 \cdot 10^{-6}$ cm thick layer of platinum. An n+-GaAs plate 2 has a structure with parallel ridges 3 also on one side. These ridges 3 also taper and have a width of $1 \cdot 10^{-5}$ cm at their upper surface. The plate 1 is placed and fixed on the plate 2 with a certain pressure. The plates 1 and 2 are rotated with respect to each other so that ridges of one plate are at a 90° angle with respect to the ridges of the other plate. The ridges which are in contact and intersect thus form small-area Schottky contacts on both plates.

The seven parallel ridges on discs 1 and 2 thus produce forty-nine electrically parallel Schottky contacts having an individual area of approximately $1 \cdot 10^{-10}$ cm$^2$. This Schottky diode arrangement has very low parasitic impedances and may be used up to very high frequencies as a mixer.

Embodiment 3

In the sectional view of FIG. 3a, 1 is a copper plate which has a structure with tapering parallel riges 3 on one side as in FIG. 2. The outer face of the ridges 3 is $5 \cdot 10^{-5}$ cm wide. The copper plate 1 is coated with a layer 5 of gold which is $2 \cdot 10^{-5}$ cm thick. An aluminium plate 1* has the same structure of parallel ridges 3 on one side as 1. An n+-GaAs plate 2 is located between the structured surfaces of the two metallic plates 1 and 1*, the plate 2 being doped $3 \cdot 10^{18}$ Sn atoms/cm$^3$. This GaAs plate 2 has the same structure of parallel ridges 3 on both sides as the plates 1 and 1*. The n+-GaAs plate is coated with a layer 6 of oxide by a chemical oxidation process and its thickness is approximately $1 \cdot 10^{-7}$ cm. The n+-GaAs plate 2 is rotated by 90° with respect to the structures in the plates 1 and 1* and placed between the structured sides of the plates 1 and 1* and is held together at a certain pressure. The Schottky contacts are formed bya the contact surfaces of the intersecting ridges on plates 1 and 2. Corresponding non-blocking-/contacts are made between the plates 1* and 2.

Figure 3B:
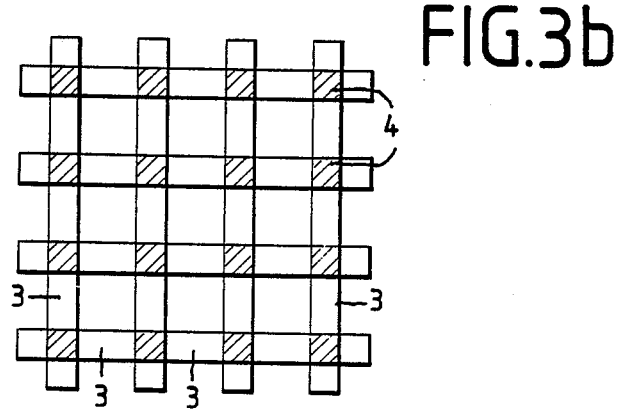

FIG. 3b shows the sixteen blocking Schottky contacts 4 between the plate 1 and the GaAs plate 2 in a view of the plane of contact and corresponding to these are non-blocking contacts 4* (FIG. 3a) between the plate 1* and the GaAs plate 2. FIG. 3a shows a ceramic casing 7 containing the Schottky diode arrangement, which casing has two coaxial diode connections 8 to the metal plates 1 and 1*.

Embodiment 4

In the sectional view of FIG. 4, 1 is a copper plate which has a structure with parallel ridges 3 running in the direction of the picture plane on one side, as in the corresponding part of FIG. 2. Ridges 3 taper to a diameter of $5 \cdot 10^{-4}$ cm at their outer face. The copper plate 1 is coated with a nickel layer 5 having a thickness $2 \cdot 10^{-4}$ cm. An n+-silicon chip or plate 2 is provided with an epitaxial layer 9 of n$^-$-silicon having a specific resistance of 20$\Omega$ cm and a thickness of $1 \cdot 10^{-3}$ cm. An n-diffusion layer 10 with a surface concentration of $5 \cdot 10^{17}$/cm$^3$ and a diffusion depth of $1 \cdot 10^{-5}$ cm is inserted into this epitaxial layer 9. Thereafter a structure with parallel ridges 3 tapering towards the upper surface to $5 \cdot 10^{-4}$ cm is inserted into the silicon chip 2. By placing the plates 1 and 2 on top of each other, and rotating them with respect to each other in the plane of the plates in the manner shown in relation to the ridge structures, a regular distribution, in terms of area, of electrically parallel Schottky contacts 4 is formed under a mechanical pressure acting on the plates. The gate voltage of this Schottky diode arrangement is reduced by the thin n-silicon layer 10. A metal contact 11 is provided on the silicon chip 2.

In order to increase the blocking voltage several such Schottky diode arrangements may be connected electrically in series.

Embodiment 5

In the sectional view of FIG. 5 the n-silicon chip 2 has a structure of conical raised portions 3 of equal size on one side, these raised portions having a curve radius of $2 \cdot 10^{-4}$ cm at their peak. A membrane or plate 1 made from spring steel and having a thickness of $2.5 \cdot 10^{-3}$ cm is disposed adjacent conical portions 3. It is fixed to the ceramics casing 7 containing the semiconductor arrangement by means of resilient folds 14 and at its lower surface rests on the peaks of the conical portions 3 with a light pressure. An n+-layer 12 is provided on the surface of the n-silicon chip 2 opposite the elevations and a metallic contact 11 on this n+-layer 2 provides the connection with a metallic baseplate 13 of the casing. The battery 16 produces a blocking or reverse voltage at the Schottky contacts 4 between the n-silicon chip 2 and the membrane 1 via an electrical resistor 17 and connections 1 and 13. The diode blocking current 19 flowing through the arrangement is registered as a voltage fluctuation 18 across resistor 17, as a result of pressure fluctuations 15 action on the membrane 1.

It will be understood that the above description of the present invention is susceptible to various modifications, changes and adaptations.

I claim:

1. A Schottky diode arrangement comprising a plate, disc or chip made from metallically conductive material and a plate, disc or chip made from semiconductor material, each said plate, disc or chip having on one of its two sides a structure with at least three raised portions in the form of parallel ridges, the plates, discs or chips being put together under pressure so that said ridges intersect and form a regular distribution of electrically parallel connected, rectifying pressure contacts in the region of the intersecting ridges, said rectifying pressure contacts constituting Schottky contacts.

2. A Schottky diode arrangement comprising a plate, disc or chip made from metallically conductive material and a plate, disc or chip made from semiconductor material, at least one said plate, disc or chip having on one of its two sides a structure with at least three raised portions, the plates, discs or chips being put together under pressure so that together they form electrically parallel connected, rectifying pressure contacts in the region of the raised portions, said rectifying pressure contacts constituting Schottky contacts; wherein an intermediate space is provided between said plates, discs or chips and said space is evacuated so that said plates, discs or chips are pressed together externally by atmospheric pressure.

3. A Schottky diode arrangement according to claim 1 wherein the rectifying pressure contacts have the same area.

4. A Schottky diode arrangement according to claim 1, wherein said metallically conductive material is a metal, a metal alloy or a degenerated doped semiconductor.

5. A Schottky diode arrangement according to claim 1, wherein said semiconductor material comprises a monocrystalline or polycrystalline, n- or p-conductive, elemental semiconductor or semiconductor compound.

6. A Schottky diode arrangement according to claim 1, wherein said plate, disc or chip made from semiconductor material comprises monocrystalline or polycrystalline semiconductor material and is coated with an insulating layer of a material selected from the group consisting of anodic or thermal oxide, SiO$_2$, nitrides or other compounds.

7. A Schottky diode arrangement according to claim 6, wherein the thickness of said insulating layer is less than $1 \cdot 10^{-6}$ cm.

8. A Schottky diode arrangement according to claim 1, comprising several Schottky diode arrangements connected in series.

* * * * *